(12) United States Patent
Lin et al.

(10) Patent No.: US 10,504,821 B2
(45) Date of Patent: Dec. 10, 2019

(54) THROUGH-SILICON VIA STRUCTURE

(71) Applicant: UNITED MICROELECTRONICS CORP., Hsin-Chu (TW)

(72) Inventors: Chu-Fu Lin, Kaohsiung (TW); Ming-Tse Lin, Hsinchu (TW); Kuei-Sheng Wu, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 101 days.

(21) Appl. No.: 15/011,433

(22) Filed: Jan. 29, 2016

(65) Prior Publication Data

US 2017/0221796 A1 Aug. 3, 2017

(51) Int. Cl.
| | |
|---|---|
| *H01L 23/528* | (2006.01) |
| *H01L 23/532* | (2006.01) |
| *H01L 21/768* | (2006.01) |
| *H01L 23/48* | (2006.01) |
| *H01L 23/535* | (2006.01) |

(52) U.S. Cl.
CPC ...... *H01L 23/481* (2013.01); *H01L 21/76831* (2013.01); *H01L 23/53223* (2013.01); *H01L 23/53238* (2013.01); *H01L 23/53252* (2013.01); *H01L 23/53266* (2013.01)

(58) Field of Classification Search
CPC ............. H01L 23/481; H01L 23/49827; H01L 23/5226; H01L 23/5384; H01L 21/02063; H01L 21/486; H01L 21/76805; H01L 21/76816; H01L 21/76831; H01L 21/76877–76879; H01L 21/76897; H01L 21/77; H01L 2224/02372; H01L 2224/05087; H01L 2924/00; H01L 2924/0002

USPC .......................... 438/637, 672, 675, 700, 702
See application file for complete search history.

(56) References Cited

U.S. PATENT DOCUMENTS

| | | | | |
|---|---|---|---|---|
| 5,682,295 A | * | 10/1997 | Horejs, Jr. | ........ G06K 19/07728 361/737 |
| 6,143,593 A | * | 11/2000 | Augusto | ........... H01L 21/28194 257/E21.191 |
| 6,204,107 B1 | * | 3/2001 | Lin | .................... H01L 21/76831 257/E21.577 |
| 6,391,769 B1 | * | 5/2002 | Lee | .................... H01L 21/28562 257/750 |
| 6,436,825 B1 | * | 8/2002 | Shue | ................. H01L 21/28556 257/E21.17 |
| 6,908,856 B2 | * | 6/2005 | Beyne | ............... H01L 21/76898 257/E21.597 |

(Continued)

OTHER PUBLICATIONS

"Stress control of plasma enhanced chemical vapor deposited silicon oxide film from tetraethoxysilane," Guan et al., MIT, J. Micromech. Microeng. 24 (2014) 027001 (6pp).*

(Continued)

*Primary Examiner* — Maliheh Malek
(74) *Attorney, Agent, or Firm* — Winston Hsu (57) ABSTRACT

A TSV structure includes a substrate comprising at least a TSV opening formed therein, a conductive layer disposed in the TSV opening, and a bi-layered liner disposed in between the substrate and the conductive layer. More important, the bi-layered liner includes a first liner and a second liner, and a Young's modulus of the first liner is different from a Young's modulus of the second liner.

5 Claims, 4 Drawing Sheets

(56) References Cited

U.S. PATENT DOCUMENTS

| | | | | |
|---|---|---|---|---|
| 7,884,016 B2* | 2/2011 | Sprey | H01L 21/02126 | 257/E21.597 |
| 7,892,942 B2* | 2/2011 | Hanson | H01L 21/02164 | 257/E21.546 |
| 7,915,659 B2* | 3/2011 | Juengling | H01L 29/66545 | 257/308 |
| 8,012,846 B2* | 9/2011 | Tsai | H01L 21/76224 | 257/E21.54 |
| 8,518,823 B2* | 8/2013 | Huang | H01L 23/481 | 257/621 |
| 8,592,991 B2* | 11/2013 | Lee | H01L 21/76898 | 257/774 |
| 8,617,989 B2* | 12/2013 | Sapre | H01L 21/768 | 257/E21.275 |
| 8,692,359 B2* | 4/2014 | Lin | H01L 21/76898 | 257/621 |
| 8,791,578 B2* | 7/2014 | Law | H01L 23/481 | 257/621 |
| 9,064,940 B2* | 6/2015 | Chen | H01L 21/76898 | |
| 9,123,789 B2* | 9/2015 | Lin | H01L 21/283 | |
| 9,230,857 B2* | 1/2016 | Hall | H01L 21/7684 | |
| 9,240,373 B2* | 1/2016 | Ebefors | H01L 23/147 | |
| 9,257,274 B2* | 2/2016 | Kang | H01L 21/022 | |
| 9,419,134 B2* | 8/2016 | Lee | H01L 29/7846 | |
| 9,455,220 B2* | 9/2016 | Shroff | G06F 17/5077 | |
| 9,466,569 B2* | 10/2016 | Shroff | H01L 23/53238 | |
| 9,484,293 B2* | 11/2016 | Ebefors | H01L 23/147 | |
| 9,666,507 B2* | 5/2017 | Chen | H01L 23/481 | |
| 10,056,353 B2* | 8/2018 | Tsai | H01L 24/92 | |
| 10,192,808 B1* | 1/2019 | Hu | H01L 23/481 | |
| 2001/0009809 A1* | 7/2001 | Miwa | H01L 21/76224 | 438/689 |
| 2002/0132471 A1* | 9/2002 | Engel | H01L 21/76802 | 438/639 |
| 2003/0116854 A1* | 6/2003 | Ito | H01L 21/76801 | 257/761 |
| 2005/0032357 A1* | 2/2005 | Rantala | H01L 21/02126 | 438/637 |
| 2005/0090097 A1* | 4/2005 | Zhang | H01L 21/76802 | 438/637 |
| 2005/0121768 A1* | 6/2005 | Edelstein | H01L 21/486 | 257/698 |
| 2005/0124151 A1* | 6/2005 | Cheng | C23C 16/401 | 438/623 |
| 2005/0136686 A1* | 6/2005 | Kim | H01L 21/02164 | 438/778 |
| 2005/0253271 A1* | 11/2005 | Nakata | H01L 21/02126 | 257/758 |
| 2006/0255427 A1* | 11/2006 | Giraudin | H01L 27/0805 | 257/532 |
| 2008/0054464 A1* | 3/2008 | Ikeda | H01L 21/76831 | 257/751 |
| 2008/0142483 A1* | 6/2008 | Hua | C23C 16/045 | 216/67 |
| 2008/0164573 A1* | 7/2008 | Basker | H01L 21/486 | 257/621 |
| 2008/0166872 A1* | 7/2008 | Takigawa | H01L 21/02063 | 438/637 |
| 2008/0166888 A1* | 7/2008 | Hsu | H01L 21/02164 | 438/787 |
| 2009/0029523 A1* | 1/2009 | Seo | H01L 21/3081 | 438/425 |
| 2009/0045458 A1* | 2/2009 | Iaconponi | H01L 29/66621 | 257/330 |
| 2009/0081862 A1* | 3/2009 | Chen | H01L 21/7682 | 438/618 |
| 2009/0267199 A1* | 10/2009 | Kim | H01L 21/76232 | 257/640 |
| 2009/0283837 A1* | 11/2009 | Huebinger | H01L 21/76224 | 257/369 |
| 2009/0302480 A1* | 12/2009 | Birner | H01L 21/76898 | 257/774 |
| 2010/0040246 A1* | 2/2010 | Windischberger | H04R 7/10 | 381/150 |
| 2010/0078690 A1* | 4/2010 | Sugiyama | H01L 21/02164 | 257/288 |
| 2011/0031581 A1* | 2/2011 | West | H01L 23/481 | 257/508 |
| 2011/0241185 A1* | 10/2011 | Koester | H01L 21/568 | 257/659 |
| 2012/0001330 A1* | 1/2012 | Huisinga | H01L 21/76898 | 257/751 |
| 2012/0080761 A1* | 4/2012 | Hsieh | H01L 21/76898 | 257/414 |
| 2012/0126374 A1* | 5/2012 | Carollo | H01L 21/76224 | 257/622 |
| 2012/0155055 A1* | 6/2012 | Kang | H05K 1/113 | 361/820 |
| 2012/0205777 A1* | 8/2012 | Lee | H01L 21/743 | 257/508 |
| 2012/0313238 A1* | 12/2012 | Sato | H01L 21/561 | 257/737 |
| 2013/0037953 A1* | 2/2013 | Chen | H01L 21/76898 | 257/751 |
| 2013/0082385 A1* | 4/2013 | Kirkpatrick | H01L 29/94 | 257/751 |
| 2013/0093098 A1* | 4/2013 | Yang | H01L 21/76898 | 257/774 |
| 2013/0140708 A1* | 6/2013 | Lin | H01L 21/76898 | 257/774 |
| 2014/0061761 A1* | 3/2014 | Kubota | H01L 29/66825 | 257/324 |
| 2014/0061855 A1* | 3/2014 | Kuo | H01L 28/90 | 257/532 |
| 2014/0061924 A1* | 3/2014 | Chen | H01L 23/481 | 257/758 |
| 2014/0077374 A1* | 3/2014 | Lin | H01L 23/528 | 257/741 |
| 2014/0225160 A1* | 8/2014 | Clifton | H01L 29/7849 | 257/190 |
| 2014/0264848 A1* | 9/2014 | Son | H01L 21/76898 | 257/737 |
| 2014/0264911 A1* | 9/2014 | Lin | H01L 23/481 | 257/774 |
| 2014/0299989 A1* | 10/2014 | Lim | H01L 23/48 | 257/751 |
| 2014/0361352 A1* | 12/2014 | Hung | H01L 21/28008 | 257/288 |
| 2015/0021702 A1* | 1/2015 | Liu | H01L 29/0653 | 257/368 |
| 2015/0126013 A1* | 5/2015 | Hwang | H01L 27/10888 | 438/381 |
| 2015/0179580 A1* | 6/2015 | Kuo | H01L 23/53238 | 257/762 |
| 2015/0196933 A1* | 7/2015 | Manna | H01L 21/02126 | 427/539 |
| 2015/0214157 A1* | 7/2015 | Canaperi | H01L 21/28556 | 438/643 |
| 2015/0243582 A1* | 8/2015 | Klewer | H01L 23/481 | 257/368 |
| 2015/0255336 A1* | 9/2015 | Moon | H01L 21/76871 | 438/624 |
| 2016/0086997 A1* | 3/2016 | Okamoto | H01L 21/76898 | 257/448 |
| 2016/0133746 A1* | 5/2016 | Su | H01L 29/66795 | 438/283 |
| 2016/0233088 A1* | 8/2016 | Feng | H01L 21/2256 | |
| 2016/0358821 A1* | 12/2016 | Chen | H01L 21/76898 | |
| 2016/0379982 A1* | 12/2016 | You | H01L 29/0657 | 257/369 |
| 2017/0012098 A1* | 1/2017 | Park | H01L 21/76229 | |
| 2017/0018509 A1* | 1/2017 | Puri | H01L 23/481 | |
| 2017/0084537 A1* | 3/2017 | Ando | H01L 23/535 | |
| 2017/0092657 A1* | 3/2017 | Lee | H01L 27/11582 | |
| 2017/0125538 A1* | 5/2017 | Sharangpani | H01L 21/28556 | |
| 2017/0140994 A1* | 5/2017 | Cai | H01L 21/823437 | |
| 2017/0148674 A1* | 5/2017 | Lu | H01L 21/76831 | |
| 2017/0170059 A1* | 6/2017 | Gutierrez | H01L 21/76816 | |

(56) References Cited

U.S. PATENT DOCUMENTS

2017/0222026 A1* 8/2017 Chen ................. H01L 29/66742
2017/0323786 A1* 11/2017 Kang .................... H01L 21/022
2018/0047626 A1* 2/2018 Chen .................... H01L 23/481

OTHER PUBLICATIONS

"Elastic properties of silicon dioxide films deposited by chemical vapour deposition from tetraethylorthosilicate," Carlotti et al., Italy, Thin Solid Films 296 (1997) 102-105.*
"Evaluation of Ultra-Low-k Dielectric Materials for Advanced Interconnects," Jin et al., Texas, Jouranl of Electronic Materials, vol. 30, No. 4, 2001.*
Curley et al., "Low-Pressure CVD and Plasma-Enhanced CVD".*
"Silicon Dioxide Film," MEMS Clearinghouse.*

* cited by examiner

FIG. 8

THROUGH-SILICON VIA STRUCTURE

BACKGROUND OF THE INVENTION

1. Field of the Invention

The present invention relates to a through-silicon-via (hereinafter abbreviated as TSV) structure, and more particularly, to a TSV structure with bi-layered liner.

2. Description of the Prior Art

With progress in semiconductor manufacturing technology, a multitude of chips may now be integrated into one single package. In some packages, TSV structure allows electrical interconnection between two or more wafers bonded to each other in a three-dimensional (3D) wafer stack. It is therefore concluded that TSV structures are critical components of 3D integrated circuits (ICs). Furthermore, TSV structures show superior applicability and can be found in radio frequency (RF) devices, micro-electro-mechanical systems (MEMS), complementary metal-oxide-semiconductor (CMOS) image sensors, flash, dynamic random access memory (DRAM), static random access memory (SRAM), analog devices, and logic devices.

Conventionally, a TSV structure is formed by deep etching into the wafer or the substrate, and filling the resulting hole with a liner, a diffusion barrier layer, and a conductive filling layer. Then, the wafer is thinned from its backside, until the conductive filling layer is exposed, and a backside metal and bumps are deposited on the thinned backside for electrical contact. Accordingly, TSV structures require high reliability between batches for mass production. However, it is found that TSV structures suffer stress issue. Specifically, the stress at the interface of the TSV structures and other materials causes cracking and/or delamination after wafer back end of line (hereinafter abbreviated as BEOL) process.

SUMMARY OF THE INVENTION

According to an aspect of the present invention, a TSV structure is provided. The TSV structure includes a substrate comprising at least a TSV opening formed therein, a conductive layer disposed in the TSV opening, and a bi-layered liner disposed in between the substrate and the conductive layer. More important, the bi-layered liner includes a first liner and a second liner, and a Young's modulus of the first liner is different from a Young's modulus of the second liner.

According to the TSV structure provided by the present invention, the bi-layered liner is disposed in between the conductive layer and the substrate. Due to the different Young's moduli, the first liner and the second liner respectively are a stiffer liner and an elastic liner. More important, the elastic liner disposed between the conductive layer and the substrate serves as a buffer and thus stress issue at the interface of the TSV structure is mitigated. Consequently, delamination defect is avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for forming a TSV structure provided by a first preferred embodiment of the present invention, wherein

DETAILED DESCRIPTION

Figure 1:
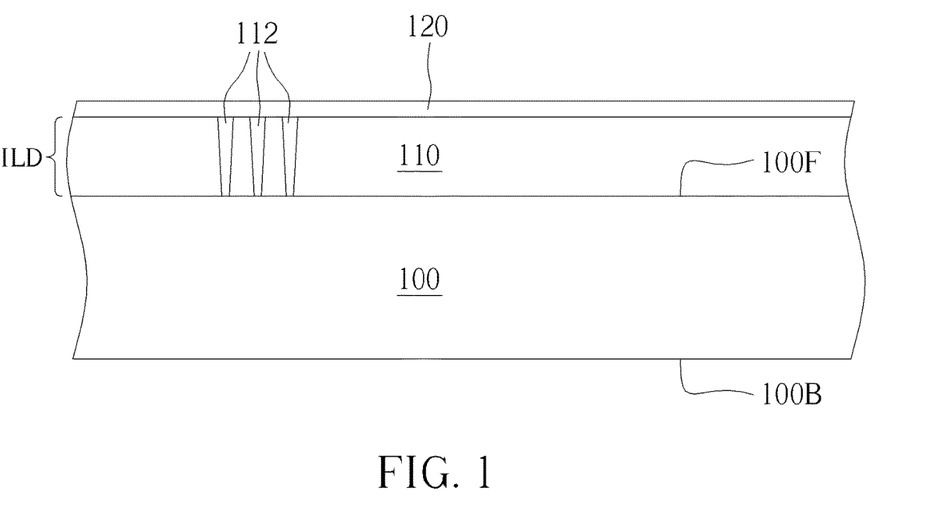

Please refer to FIGS. 1-6, which are schematic drawings illustrating a method for forming a TSV structure provided by a preferred embodiment of the present invention. As shown in FIG. 1, a substrate 100 is provided. The substrate 100 may include, for example but not limited to, silicon, silicon germanium (SiGe), or other suitable semiconductor substrate used in the semiconductor manufacturing industry, and the substrate 100 may be a p-type or an n-type substrate material. Also, as shown in FIG. 1, the substrate 100 includes a front side 100F and a back side 100B.

Active components (not shown) such as transistors and diodes that are able to control the follow of electrical currents, and passive components (not shown) such as capacitors, inductors, resistors, and transformers that are able to create a relationship between voltage and current necessary to perform electrical circuit functions are formed over the front side 100F of the substrate 100 by a series of process steps including doping, deposition, photolithography, etching, and planarization. The above mentioned active and passive components are electrically connected to form functional electrical circuits. It should be noted that those active and passive components are omitted from FIGS. 1-7 in the interest of brevity. An inter-layer dielectric (hereinafter abbreviated as ILD) layer 110 and contact plugs 112 formed in the ILD layer 110 can be built on the front side 100F of the substrate 100 for constructing electrical connections between the abovementioned electrical devices. In some embodiments of the present invention, one or more inter-metal dielectric (hereinafter abbreviated as IMD) layer (not shown) can be formed on the ILD layer 110, and metal layers (not shown) and vias (not shown) are formed in the IMD layer. The ILD layer 110 can include low-k dielectric material, such as phosphosilicate glass (PSG), borophosphosilicate glass (BPSG), fluorosilicate glass (FSG), $SiO_xC_y$, Spin-on glass (SOG), spin-on-polymer (SOP), silicon carbon materials, compounds thereof, composites thereof, combination thereof, or the like, formed by any suitable method known in the art. Then, a hard mask layer 120 is formed on the ILD layer 110 as shown in FIG. 1. In some embodiments of the present invention, the hard mask layer 120 can include silicon nitride, but not limited to this. Additionally, the hard mask layer 120 can be a single layer or a multi-layered structure, but not limited to this.

Figure 2:
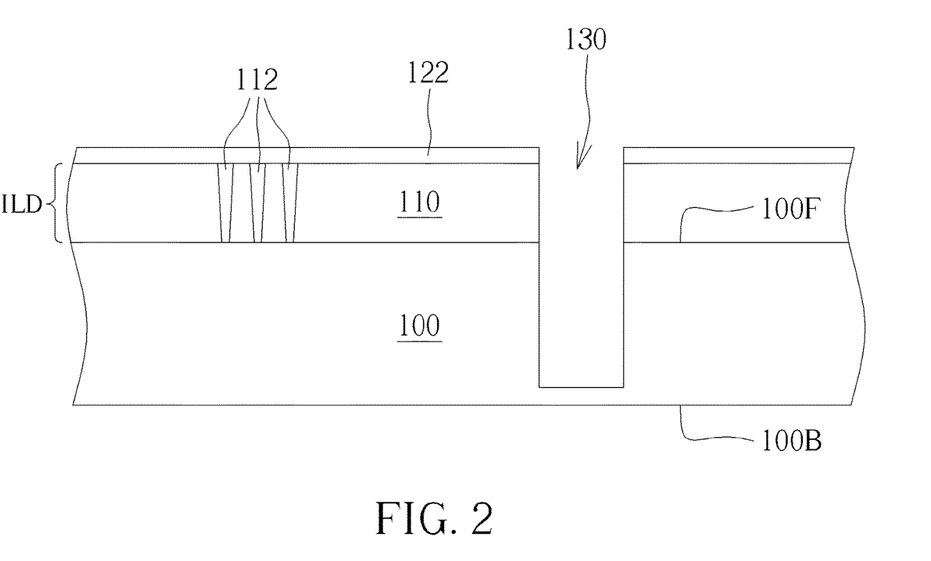
FIG. 2 is a schematic drawing in a step subsequent to FIG. 1.

Please refer to FIG. 2. Next, the hard mask layer 120 is patterned and thus a patterned hard mask 122 is obtained. The patterned hard mask 122 is used to define a placement and a size of TSV structures to be formed. Then, at least a TSV opening 130 is formed by any appropriate method such as, for example but not limited to, one or more etching processes, laser techniques, or the like. As shown in FIG. 2, the TSV opening 130 is formed to penetrate the ILD layer 110 and downward deep into the substrate 100. However, the TSV opening 130 does not extend completely through the substrate 100. In other words, semiconductor material of the substrate 100 is exposed at a bottom of the TSV opening 130 as shown in FIG. 2. Additionally speaking, though the TSV opening 130 is etched into the substrate 100 after front-end-of-line (hereinafter abbreviated as FEOL) processing (device creation) in the preferred embodiment, the TSV opening 130 can be formed before FEOL processing according to other embodiments of the present invention.

Figure 3:
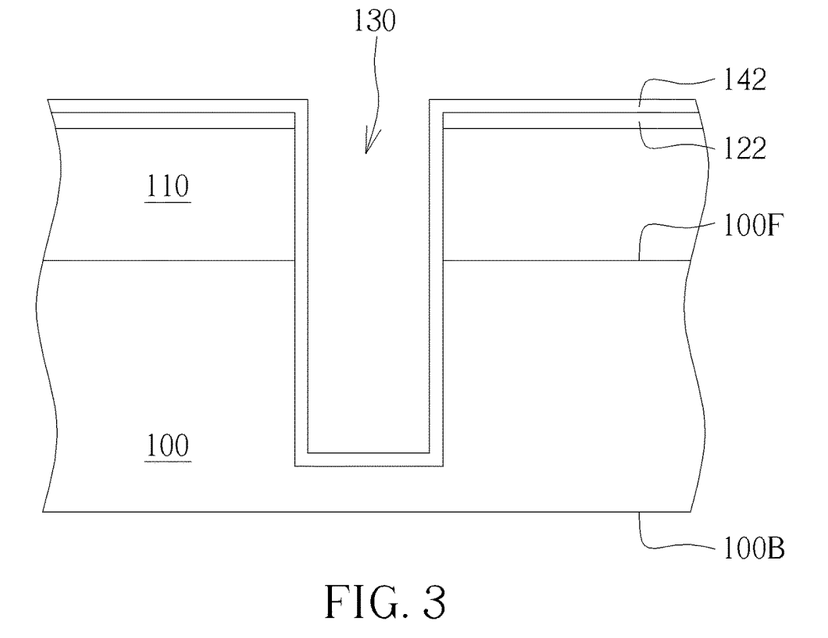
FIG. 3 is a schematic drawing in a step subsequent to FIG. 2 and a partially enlarged view of FIG. 2.

Please refer to FIG. 3. After forming the TSV opening 130, a first liner 142 is formed to line a sidewall and the bottom of the TSV opening 130. It is noteworthy that the first liner 142 includes insulating materials with a Young's modulus larger than 70. Consequently, the first liner 142 can include, for example but not limited to, SiO (Young's modulus is 71 GPa), $SiN_x$ (Young's modulus is in a range from 164 GPa to 297 GPa), or the like. It is found that Young's modulus of material can be altered by different formation methods and/or treatments. For example, Young's modulus of a SiO layer formed by a plasma-activated conformal film deposition (CFD) is 71.3 GPa. Usually, Young's modulus is a measure of stiffness of solid material. Therefore, a material whose Young's modulus is high can be approximated as rigid.

Figure 4:
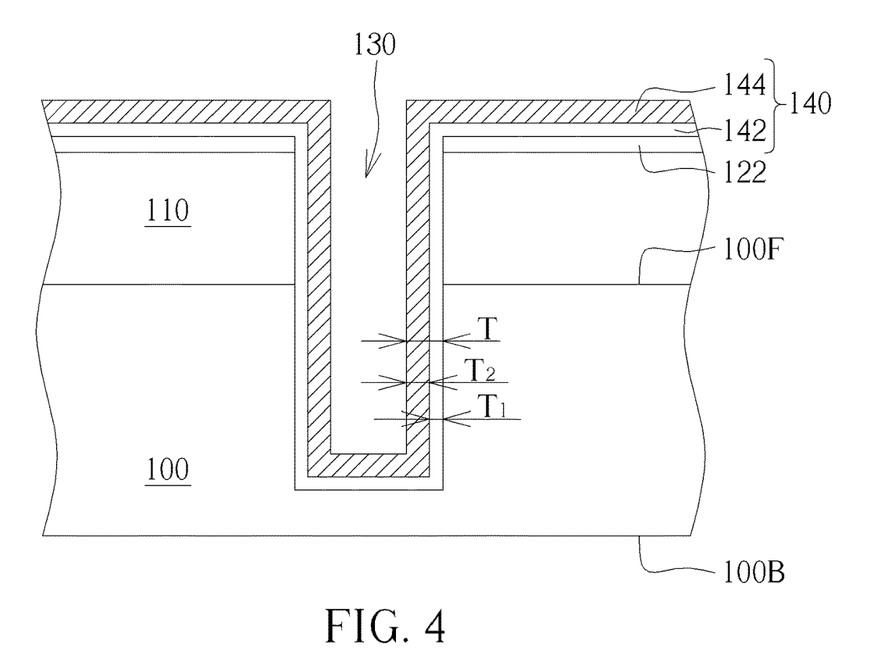
FIG. 4 is a schematic drawing in a step subsequent to FIG. 3.

Please refer to FIG. 4. After forming the first liner 142, a second liner 144 is formed on the first liner 142. It is noteworthy that the second liner 144 includes insulating materials with a Young's modulus different from the first liner 142. Specifically, the Young's modulus of the second liner 144 is smaller than the first liner 142. For example, the Young's modulus of the second liner 144 is preferably smaller than 70. Consequently, the second liner 144 can include, for example but not limited to, low-k material (Young's modulus is 9.5 GPa), benzocyclobutene polymer (BCB) (Young's modulus is 3), or the like. As mentioned above, Young's modulus of material can be altered by different formation methods and/or treatments. For example, Young's modulus of a SiO layer formed by a sub-atmospheric pressure thermal chemical vapor deposition (hereinafter abbreviated as SACVD) and a physical enhanced oxidation (PEOX) is 53.3 GPa. And Young's modulus of a SiO layer formed by a SACVD is 30.4 GPa. As mentioned above, Young's modulus is a measure of stiffness of solid material. Therefore, a material whose Young's modulus is low can be approximated as elastic. More important, the first liner 142 and the second liner 144 construct a bi-layered liner 140 as shown in FIG. 4. Consequently, the first liner 142 includes a thickness $T_1$, the second liner 144 includes a thickness $T_2$, and the bi-layered liner 140 includes a thickness T which is a sum of the thickness $T_1$ and the thickness $T_2$. And the thickness T of the bi-layered liner 140 is in a range of 1000 angstroms (Å) to 1 micrometer (μm). In some embodiments of the present invention, the thickness $T_1$ of the stiffer first liner 142 is equal to the thickness $T_2$ of the elastic second liner 144. In some embodiments of the present invention, the thickness $T_1$ of the stiffer first liner 142 (with the larger Young's modulus) is smaller than a thickness $T_2$ of the elastic second liner 144 (with the smaller Young's modulus), preferably. Particularly, a ratio of the thickness $T_1$ of the first liner 142 to the thickness $T_2$ of the second liner 144 is in a range of 1:1 to 1:2.

It is noteworthy that, the first liner 142 and the second liner 144 can include different materials as mentioned above. However, the first liner 142 and the second liner 144 can include the same material formed by different processes or treated by different processes since those processes decisively differentiate Young's modulus of the first liner 142 and the second liner 144.

Figure 5:
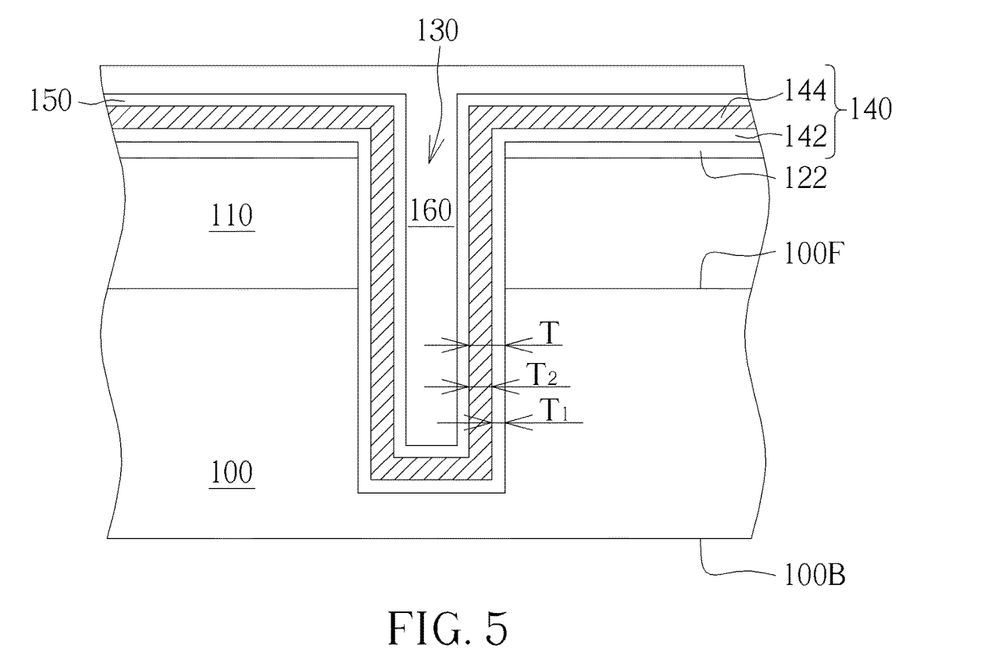
FIG. 5 is a schematic drawing in a step subsequent to FIG. 4.

Please refer to FIG. 5. After forming the second liner 144, a diffusion barrier layer 150 is formed on the second liner 144 and following by filling the TSV opening 130 with a conductive layer 160. In some embodiments of the present invention, the diffusion barrier layer 150 includes tantalum nitride (TaN), tantalum (Ta), titanium nitride (TiN), titanium (Ti), cobalt tungsten (CoW), or the like, but not limited to this. In some embodiments of the present invention, the conductive layer 160 includes copper (Cu), tungsten (W), aluminum (Al), silver, and the combination thereof, but not limited to this. As shown in FIG. 5, the bi-layered liner 140 is disposed in between the conductive layer 160 and the substrate 100 while the diffusion barrier layer 150 is disposed in between the conductive layer 160 and the bi-layered liner 140.

Figure 6:
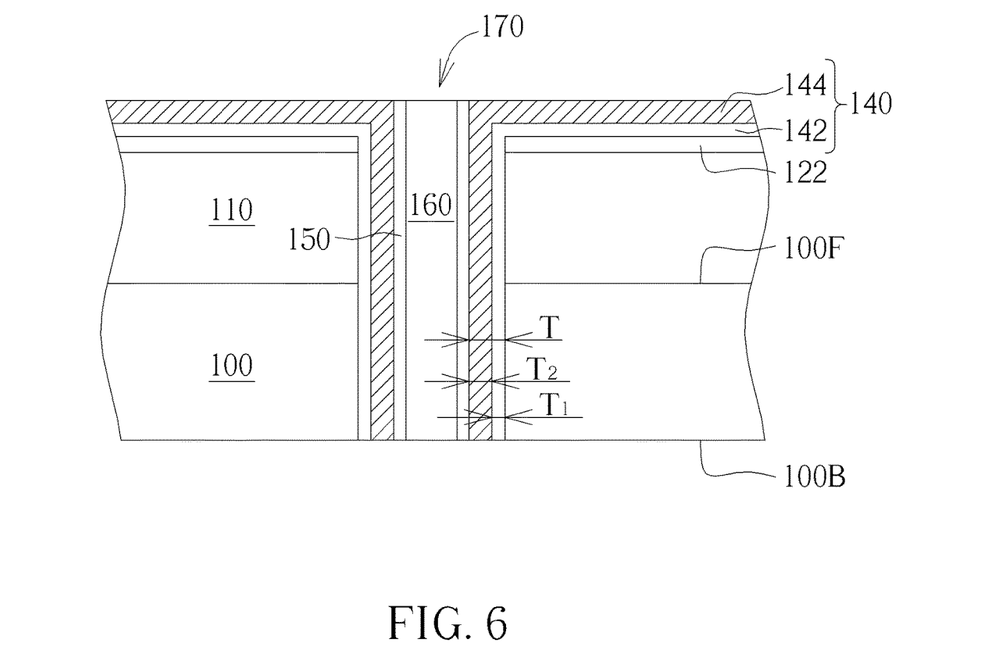
FIG. 6 is a schematic drawing in a step subsequent to FIG. 5.

Please refer to FIG. 6. Next, a planarization is performed to remove superfluous conductive materials, and thus a TSV structure 170 is obtained as shown in FIG. 6. In some embodiments of the present invention, BEOL interconnection is constructed and electrically connected to the one or more devices on the front side 100F of the substrate 100 after forming the TSV structure 170. Furthermore, a back-thinning process as known in the art is performed so that the conductive layer 160 is exposed at the back side 100B of the substrate 100. Thereafter, other conductive elements can be formed and electrically connected to the exposed TSV structure 170 for constructing external connection resulting in a 3D IC device having two, three, or more substrates.

According to the preferred embodiment of the present invention, the TSV structure 170 as a whole includes the conductive layer 160, the diffusion barrier layer 150, and the bi-layered liner 140 (including the first liner 142 and the second liner 144). More important, the second liner 144, which includes the smaller Young's modulus and thus is taken as the elastic liner, is disposed in between the conductive layer 160 and the first liner 142, which includes the larger Young's modulus and thus is taken as the stiffer liner. It is well-known that a coefficient of thermal expansion (CTE) of the conductive layer 160 is larger than that of the substrate 100, therefore stress generated during thermal process may induce cracking and/or delamination and thus severely damages the whole package. However, because the elastic second liner 144 of the bi-layered liner 140 is disposed in between the conductive layer 160 and the substrate 100, the stress induced from the conductive layer 160 is buffered by the elastic second liner 144. More important, the bi-layered liner 140 including the plural and different Young's moduli is thinner than those conventional single-layered liner and/or conventional liner including unitary Young's modulus. Consequently, a capacitance is reduced.

Figure 7:
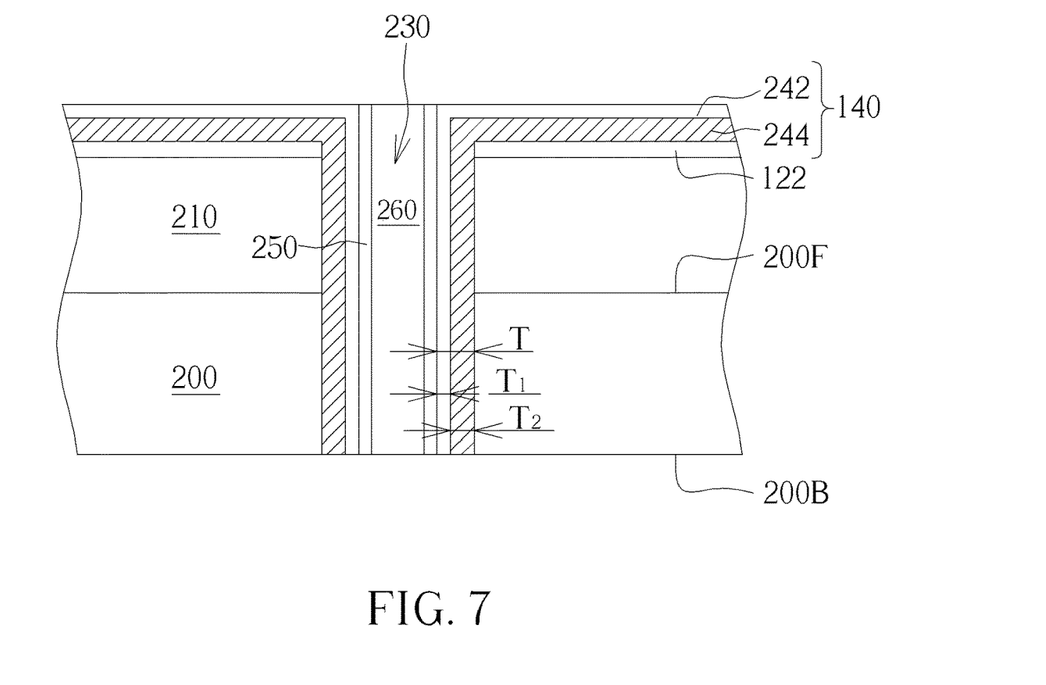
FIG. 7 is a schematic drawing illustrating a TSV structure provided by a second preferred embodiment of the present invention.

Please refer to FIG. 7, which is a schematic drawing illustrating a TSV structure provided by a second preferred embodiment of the present invention. It should be noted that elements the same in the first and second preferred embodiments can be formed by the same methods and/or processes as known in the art, and those elements can include the same materials, therefore details are omitted in the interest of brevity.

As shown in FIG. 7, a substrate 200 is provided. The substrate 200 includes a front side 200F and a back side 200B. Active and passive components (not shown) are formed over the front side 200F of the substrate 200 by a series of process steps including doping, deposition, photolithography, etching, and planarization. And the above mentioned active and passive components are electrically connected to form functional electrical circuits. As mentioned above, an ILD layer 210 and contact plugs (not shown) formed in the ILD layer 210 can be built on the front side 200F of the substrate 200 for constructing electrical connections between the abovementioned electrical devices. As mentioned above, in some embodiments of the present invention, one or more IMD layer can be formed on the ILD layer 210, and metal layers and vias are formed in the IMD layer. Next, a patterned hard mask layer (not shown) for defining a placement and a size of TSV structures is formed on the ILD layer 210.

Next, at least a TSV opening 230 is formed in the substrate 200. It is noteworthy that the TSV opening 230 is formed to penetrate the ILD layer 210 and downward deep into the substrate 200. However, the TSV opening 230 does not extend completely through the substrate 200. In other words, semiconductor material of the substrate 200 is exposed at a bottom of the TSV opening 230. As mentioned above, though the TSV opening 230 is etched into the substrate 200 after FEOL processing in the preferred embodiment, the TSV opening 230 can be formed before FEOL processing according to other embodiments of the present invention.

Please refer to FIG. 7 again. After forming the TSV opening 230, a first liner 242 and a second liner 244 are formed to line a sidewall and the bottom of the TSV opening 230. It is noteworthy that the first liner 242 includes insulating materials with a Young's modulus larger than 70 while the second liner 244 includes insulating materials with a Young's modulus smaller than 70. As mentioned above, the first liner 242 and the second liner 244 can include different materials. Alternatively, the first liner 242 and the second liner can include a same material formed by different processes or treated by different processes since those processes decisively differentiate the Young's modulus of the first liner 242 and the second liner 244. The first liner 242 and the second liner 244 construct a bi-layered liner 240 as shown in FIG. 7. Consequently, the first liner 242 includes a thickness $T_1$, the second liner 244 includes a thickness $T_2$, and the bi-layered liner 240 includes a thickness T which is a sum of the thickness $T_1$ and the thickness $T_2$. And the thickness T of the bi-layered liner 240 is in a range of 1000 Å to 1 μm. In some embodiments of the present invention, the thickness $T_1$ of the stiffer first liner 242 is equal to the thickness $T_2$ of the elastic second liner 244. In some embodiments of the present invention, the thickness $T_1$ of the stiffer first liner 242 (with the larger Young's modulus) is smaller than a thickness $T_2$ of the elastic second liner 244 (with the smaller Young's modulus), preferably. Particularly, a ratio of the thickness $T_1$ of the first liner 242 to the thickness $T_2$ of the second liner 244 is in a range of 1:1 to 1:2.

Figure 8:
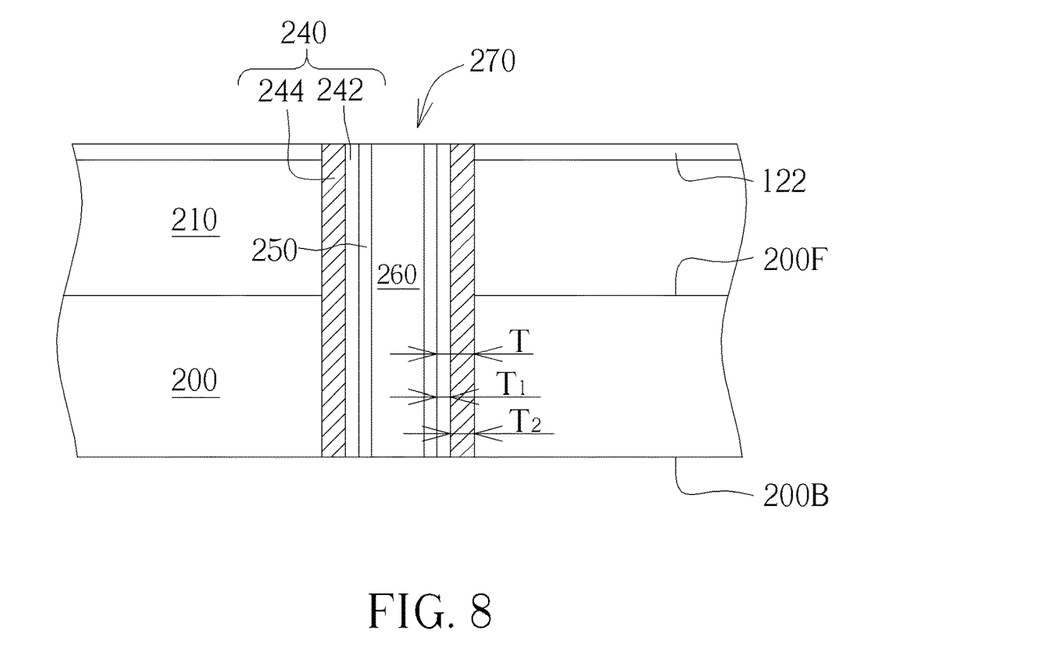
FIG. 8 is a schematic drawing illustrating a TSV structure provided by modification to the present invention.

Please still refer to FIG. 7. After forming the bi-layered liner 240, a diffusion barrier layer 250 is formed on the first liner 242 and following by filling the TSV opening 230 with a conductive layer 260. As shown in FIG. 8, the bi-layered liner 240 is disposed in between the conductive layer 260 and the substrate 200 while the diffusion barrier layer 250 is disposed in between the conductive layer 260 and the bi-layered liner 240. More important, the second liner 244 is formed in between the substrate 200 and the first liner 242, and the first liner 242 is disposed in between the second liner 244 and the conductive layer 260 according to the preferred embodiment.

Next, a planarization is performed to remove superfluous conductive materials, and thus a TSV structure 270 is obtained as shown in FIG. 7. In some embodiments of the present invention, BEOL interconnection is constructed and electrically connected to the one or more devices on the front side 200F of the substrate 200 after forming the TSV structure 270. Furthermore, a back-thinning process as known in the art is performed so that the TSV structure 270 is exposed at the back side 200B of the substrate 200. Thereafter, other conductive elements can be formed and electrically connected to the exposed TSV structure 270 for constructing external connection resulting in a 3D IC device having two, three, or more substrates.

Please refer to FIG. 8, which is a schematic drawing illustrating a modification to the present invention. According to the modification, the planarization is performed to remove superfluous conductive materials and the bi-layer liner 240 from the front side 200F of the substrate 200, and thus a TSV structure 270 is obtained as shown in FIG. 8. Then, as mentioned above, BEOL interconnection can be constructed and electrically connected to the one or more devices on the front side 200F of the substrate 200 after forming the TSV structure 270. As mentioned above, a back-thinning process as known in the art is performed so that the TSV structure 270 is exposed at the back side 200B of the substrate 200.

Accordingly, the preferred embodiment of the present invention, the TSV structure 270 as a whole includes the conductive layer 260, the diffusion barrier layer 250, and the bi-layered liner 240 (including the first liner 242 and the second liner 244). More important, the second liner 244 with the smaller Young's modulus serves as a buffer layer. Therefore, stress induced from the conductive layer 260 is buffered by the elastic liner 244. More important, the bi-layered liner 240 including the plural and different Young's moduli is thinner than those conventional single-layered liner and/or conventional liner including unitary Young's modulus. Consequently, a capacitance is reduced.

According to the TSV structure provided by the present invention, the bi-layered liner is disposed in between the conductive layer and the substrate. Due to the different Young's moduli, the first liner and second liner respectively are a stiffer liner and an elastic liner. More important, the elastic liner disposed between the conductive layer and the substrate serves as a buffer and thus stress issue at the interface of the TSV structure is mitigated. Consequently, delamination defect is avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through-silicon-via (TSV) structure comprising:
    a substrate comprising at least a TSV opening formed therein;
    a conductive layer disposed in the TSV opening; and
    a bi-layered liner formed in between the substrate and the conductive layer, the bi-layered liner comprising a first liner and a second liner, wherein the first liner is disposed in between the second liner and the substrate, and the second liner is disposed in between the first liner and the conductive layer, and the first liner is directly contacted with the second liner, and wherein the first liner and the second liner comprise a same material formed by different processes or treated by different processes, wherein a Young's modulus of the second liner is smaller than a Young's modulus of the first liner, and a thickness of the first liner is equal to a thickness of the second liner.

2. The TSV structure according to claim 1, wherein the substrate comprises a front side and a back side, and the conductive layer is exposed at the back side of the substrate.

3. The TSV structure according to claim 1, wherein the Young's modulus of the second liner is smaller than 70 GPa, and the Young's modulus of the first liner is larger than 70 GPa.

4. The TSV structure according to claim 1, wherein a thickness of the bi-layered liner is in a range of 1000 angstroms (Å) to 1 micrometer (μm).

5. The TSV structure according to claim 1, further comprising a diffusion barrier layer disposed in between the conductive layer and the bi-layered liner.

* * * * *